United States Patent

Iura et al.

Patent Number: 5,281,765
Date of Patent: Jan. 25, 1994

[54] WIRING ASSEMBLY FOR EQUIPMENT AND A METHOD FOR PRODUCING THE SAME

[75] Inventors: Kazuo Iura; Kazuhito Saka; Yoshiaki Yamano, all of Mie, Japan

[73] Assignee: Sumitomo Wiring Systems, Ltd., Mie, Japan

[21] Appl. No.: 889,140

[22] Filed: May 27, 1992

[51] Int. Cl.⁵ .............................................. H01B 7/08
[52] U.S. Cl. .............................. 174/117 F; 174/71 R; 174/72 C; 174/72 TR; 174/88 R
[58] Field of Search ........ 174/117 F, 117 FF, 72 TR, 174/72 C, 72 R, 71 R, 84 R, 88 R, 117 R

[56] References Cited

U.S. PATENT DOCUMENTS

| | | | |
|---|---|---|---|
| 294,703 | 3/1884 | Verstraete | 174/72 R |
| 2,218,545 | 10/1940 | Morten | 174/72 C X |
| 3,168,617 | 2/1965 | Richter | 174/117 FF |
| 3,633,189 | 1/1972 | Billawala | 174/117 FF X |
| 3,805,213 | 4/1974 | Austin | 174/117 F X |
| 4,075,420 | 2/1978 | Walton | 174/117 F |
| 4,353,372 | 10/1982 | Ayer | 174/117 FF X |
| 4,375,379 | 1/1983 | Luetzow | 174/72 TR X |
| 4,426,548 | 1/1984 | Oritsuki et al. | 174/72 R |
| 4,460,804 | 7/1984 | Svejkovsky | 174/117 F X |
| 4,505,980 | 3/1985 | Nishizawa et al. | 174/120 SR X |
| 4,588,456 | 5/1986 | Dery et al. | 174/117 FF X |
| 4,626,298 | 12/1986 | Allard | 174/117 F X |
| 4,731,503 | 3/1988 | Kitanishi | 174/88 R |
| 5,130,499 | 7/1992 | Dijkshoorn | 174/117 F X |
| 5,147,510 | 9/1992 | Iura et al. | 174/117 F |

FOREIGN PATENT DOCUMENTS

| | | | |
|---|---|---|---|
| 2108997 | 8/1972 | Fed. Rep. of Germany | 174/117 F |
| 3020537 | 12/1981 | Fed. Rep. of Germany | 174/72 R |
| 1210251 | 3/1960 | France | 174/117 F |
| 2034102 | 5/1980 | United Kingdom | 174/117 F |
| 8606867 | 11/1986 | World Int. Prop. O. | 174/117 F |

Primary Examiner—Morris H. Nimmo
Attorney, Agent, or Firm—Sughrue, Mion, Zinn, Macpeak & Seas

[57] ABSTRACT

A wiring assembly for equipment is produced at a low cost and has the same wiring connection as a flexible printed cable (FPC). Various kinds of terminal treatment processes are applied to the assembly. A circuit is formed by arranging polyurethane-insulated magnet wires 21 on a polyimide (PI) sheet 22 formed along a wiring circuit having bent, curved, and branched (jointed) portions. The formed circuit is coated with a PI sheet 23. Accordingly, an etching step such as in an FPC is not required. It is possible to produce a wiring assembly having the same function as an FPC at a low cost and to effect various kinds of terminal treatments as with an FPC. A wiring assembly having a single crossing in a circuit is formed by using insulated conductors.

6 Claims, 6 Drawing Sheets

WIRING ASSEMBLY FOR EQUIPMENT AND A METHOD FOR PRODUCING THE SAME

BACKGROUND OF THE INVENTION

1. Field of the Invention

This invention relates to a wiring assembly used in home electrical equipment and office automation equipment such as video tape recorders, video cameras, plain paper copiers (PPC), a personal computers (PC), facsimiles and the like, and to a method for producing the same.

2. Statement of the Prior Art

In the above wiring assembly, there are provided a flat ribbon cable (FRC) and a flexible flat cable (FFC) in which a plurality of conductors extending in parallel with each other are disposed between two insulation sheets.

However, such a wiring assembly is subject to some limitations such as limited flexibility due to its straight form as mentioned above.

On the other hand, there is a flexible printed cable (FPC) produced by the steps of designing a circuit in line with an arrangement of parts in equipment, etching a pressed copper foil or an electrolyzed copper foil on a base sheet to form a circuit and coating the circuit with an overlay sheet. This FPC can be connected to the parts in the equipment without any difficulty, since the circuit is made in accordance with the arrangement of the parts in the equipment. However, the FPC requires an etching step and, if a plurality of layers of wiring are required, complicated steps such as double side etching must be accomplished, since multi-layer etching cannot be effected in a single plane. Consequently, such etching incurs a high cost.

SUMMARY OF THE INVENTION

An object of the present invention is to provide a wiring assembly for equipment which has the same wiring connection as an FPC, and many kinds of terminal treatment processes such as FPC, FRC, FFC and the like can be applied thereto.

Another object of the present invention is to provide a method for producing the above wiring assembly at a low cost.

In order to achieve the above objects, a wiring assembly in accordance with the present invention, comprises:

an insulation sheet formed along a wiring circuit having bent, curved, and branched portions;

a plurality of conductors arranged along said wiring circuit; and a flexible insulation material for covering said conductors on said sheet.

The insulation sheet may be selected from materials with a thickness of 10 to 500 $\mu$m such as polyethylene terephthalate (PET), polyvinyl chloride (PVC), polyimide (PI), polyphenylene sulfide (PPS) and the like. If necessary, the insulation sheet may be coated with an adherent resin or an adhesive resin.

One way of covering the conductors on the sheet with the flexible insulation material consists of coating it with an insulating resin, coating it with a sheet of PI, PET, PVC, or PPS, or laminating a similar sheet with an adherent resin or adhesive resin.

Conductors may be selected from a material in the form of wire having a diameter of 0.03 to 1.0 mm such as a soft copper wire, a tin-plated soft copper wire, other plated wire, a copper alloy wire, a clad wire made of different metals or a twisted wire made of a plurality of wires from one of the above wires. The twisted wire has no insulating sheath. When an insulated wire, which is made by covering the above wires with an insulating sheath, such as a magnet wire, is used in a wiring assembly, it is possible to form a crossing or a branching (jointing) of wires. This allows a circuit arrangement to be more flexible and more compact.

A method for producing the above wiring assembly, comprises the steps of:

arranging a plurality of conductors on an insulation sheet in accordance with a wiring circuit having bent, curved, and branched portions;

covering said conductors with a flexible insulation material to insulate them and secure them to said sheet; and cutting out any unnecessary or excess portions of said sheet along said wiring circuit.

The wiring assembly thus constructed requires no complicated etching step such as an FPC. The terminal treatment in the wiring assembly is carried out in a similar way to the conventional FPC, FRC, FFC or the like.

DETAILED DESCRIPTION OF THE PREFERRED EMBODIMENTS

Referring now to FIGS. 1 through 8, a wiring assembly for equipment and a method for producing the same in accordance with the present invention will be explained below.

Figure 1:
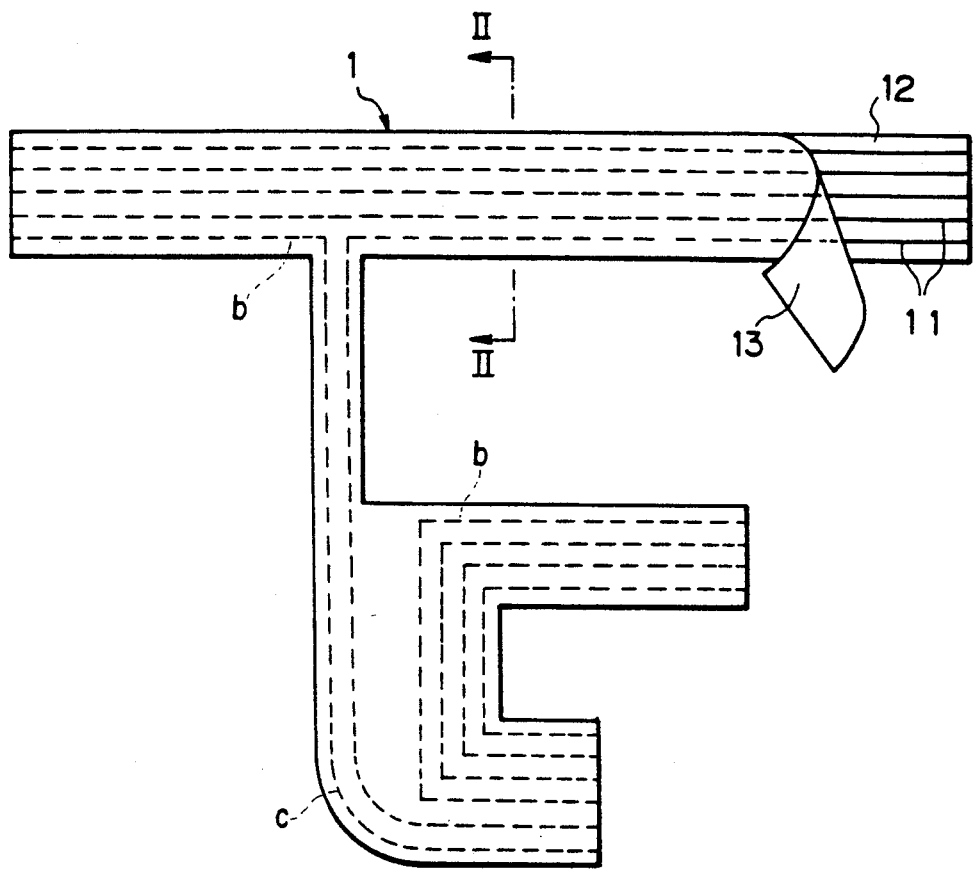
FIG. 1 is a plan view of a first embodiment of a wiring assembly in accordance with the present invention.
Figure 2:
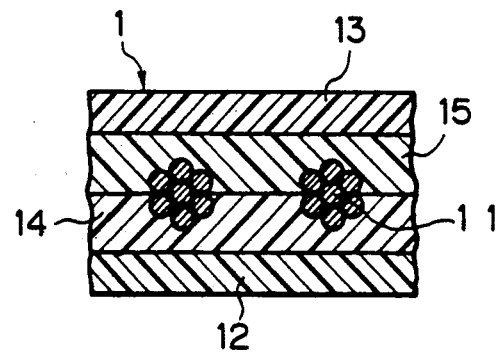
FIG. 2 is a fragmentary sectional view taken along a line II—II in FIG. 1.

As shown in FIGS. 1 and 2, the wiring assembly 1 is produced by the steps of: arranging a plurality of tin-plated soft copper wires 11 with a diameter of 0.1 mm on a PET sheet 12 with a thickness of 25 $\mu$m having an adherent layer 14 with a thickness of 40 $\mu$m to form a circuit; covering the circuit with a PET sheet 13 with a thickness of 25 $\mu$m having a thermoplastic adhesion layer 15 with a thickness of 40 $\mu$m; and cutting out unnecessary or excess portions of the sheets 12 and 13.

Distances between the conductors 11 depend upon distances of corresponding connection terminals, for example, 0.5, 0.8, 1.0, 1.25 mm. The distances may be widened only at terminal ends.

Figure 3:
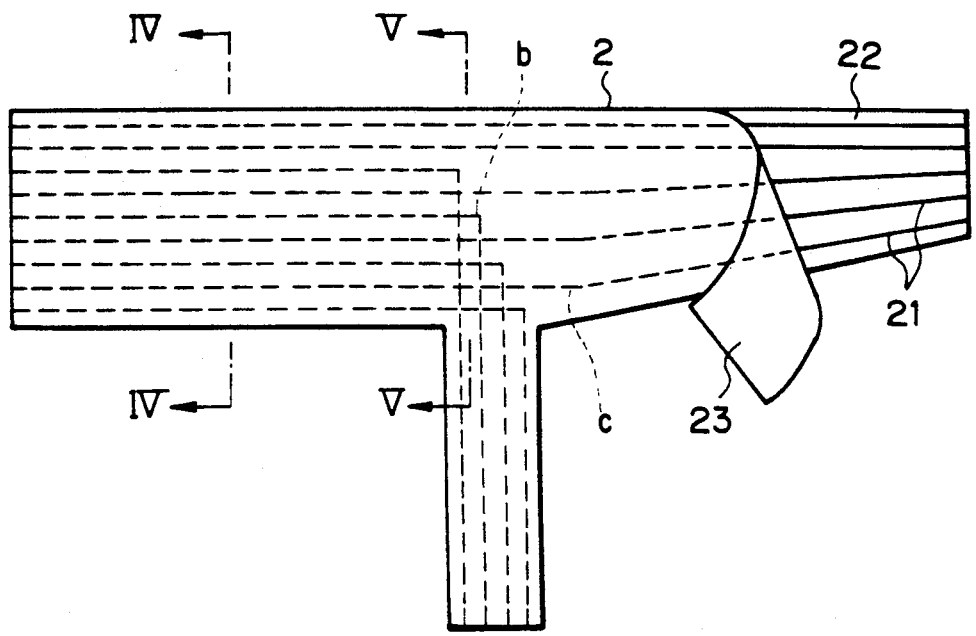
FIG. 3 is a plan view of a second embodiment of a wiring assembly for an equipment in accordance with the present invention.
Figure 4:
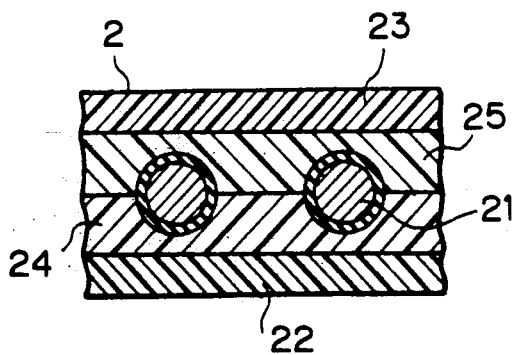
FIG. 4 is a fragmentary sectional view taken along a line IV—IV in FIG. 3.
Figure 5:
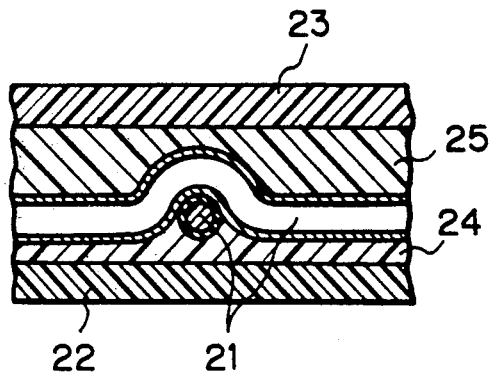
FIG. 5 is a fragmentary sectional view taken along a line V—V in FIG. 3.

FIGS. 3 through 5 show another embodiment of the present invention. As shown in FIGS. 3 and 4, the wiring assembly 2 is produced by the steps of: arranging a plurality of polyurethane-insulated magnet wires 21 with a diameter of 0.1 mm on a PI sheet 22 with a thickness of 25 μm having a heat-proof adherent layer 24 with a thickness of 40 μm to form a circuit; covering the circuit with a PI sheet 23 with a thickness of 25 μm having a thermoplastic adhesive layer 25 with a thickness of 40 μm; and cutting out unnecessary or excess portions of the sheets 22 and 23.

Since insulated conductors are used in this embodiment, it is possible to maintain an insulated state between the conductors, even if the conductors intersect with each other as shown in FIG. 5.

The above two embodiments use a circuit having bent or sharp angle portion bond curved portions C of the conductors. However these embodiments may be applied to a circuit having branched portions of conductors as shown in FIGS. 6A through 6E.

Figure 6A:
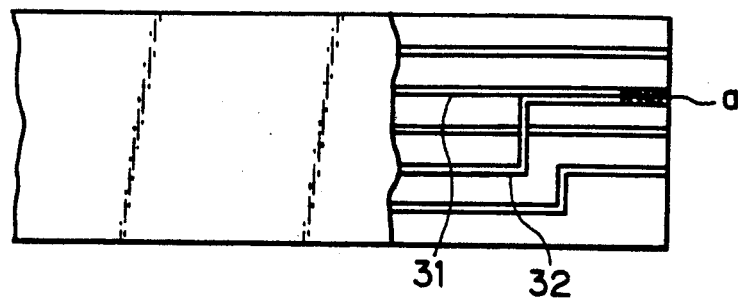
FIGS. 6A through 6E are plan views showing various forms of branches in the wiring assembly.
Figure 6B:
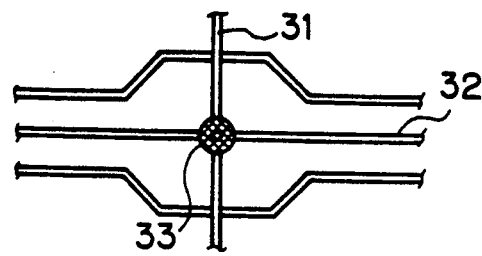
Figure 6C:
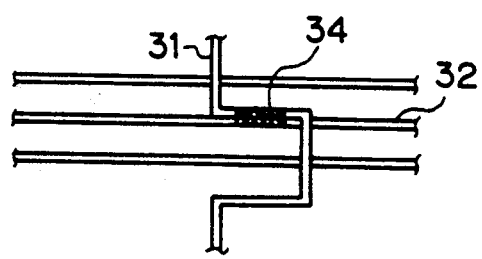
Figure 6D:
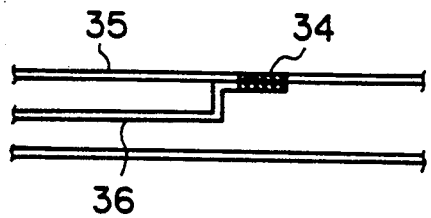
Figure 6E:
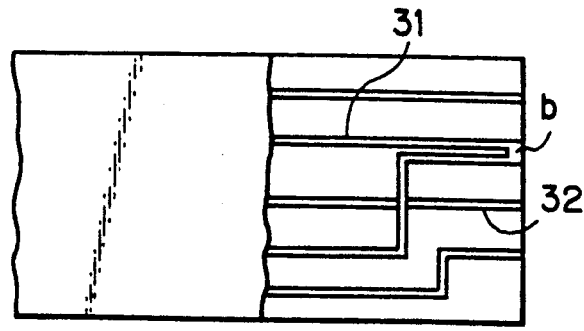

FIG. 6A shows a circuit in which two insulated conductors 31 and 32 have stripped off insulation covers at ends "a" and the stripped ends are soldered, welded, or coupled by other jointing means. If insulated conductors are used, they may be used at an orthogonal cross 33 or a parallel joint 34 as shown in FIG. 6B or 6C as well as the ends. The non-insulated conductors 35 and 36 must be connected with each other through a parallel joint 34 as shown in FIG. 6D. FIG. 6E shows an alternative of FIG. 6A and has a bent or sharp angle portion "b".

Figure 7A:
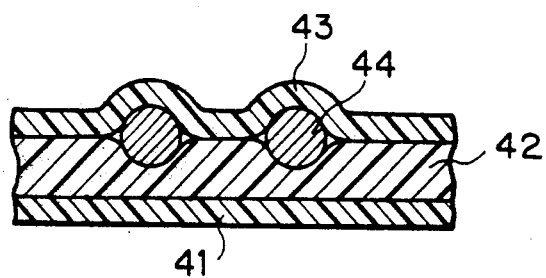
FIGS. 7A and 7B are similar views to FIG. 4 but show different covering forms.
Figure 7B:
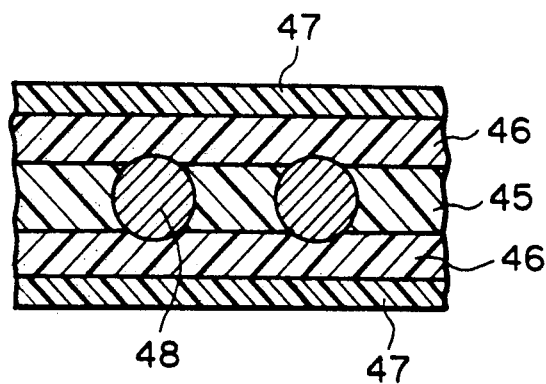

FIGS. 7A and 7B show other covering forms than those shown in FIGS. 4 and 5. FIG. 7A shows a wiring assembly which is produced by providing an adherent layer 42 on a sheet 41, arranging conductors 44 on the layer 42, and coating the conductors 44 and the layer 42 with an insulation resin 43. FIG. 7B shows a wiring assembly which is produced by coating an insulation sheet 47 with an adhesion layer 46, applying an adherent layer 45 holding conductors 48 on the adhesion layer 46, applying another adhesion layer 46 on the layer 45, and further applying another insulation sheet 47 on the layer 46.

Figure 8A:
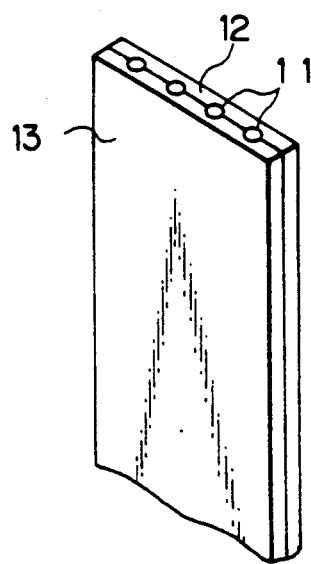
FIGS. 8A through 8F are perspective views showing various forms of terminal treatment of the wiring assembly for equipments.
Figure 8B:
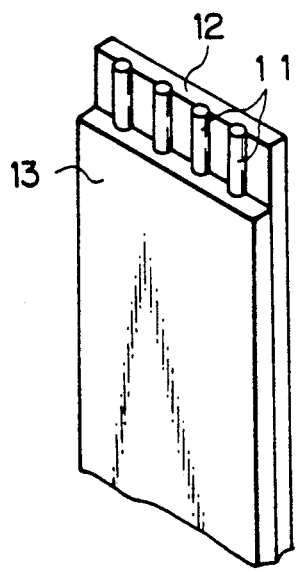
Figure 8C:
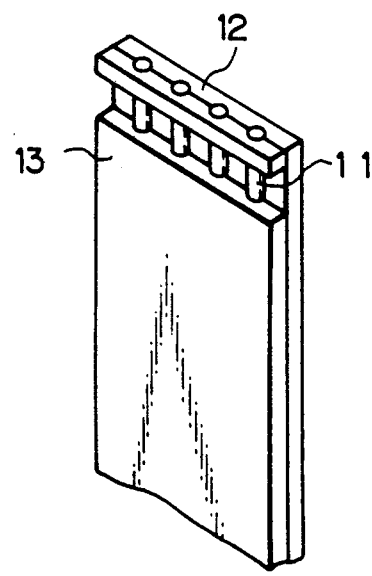

FIGS. 8A through 8F show various kinds of terminal treatments in the above wiring assembly. FIG. 8A shows a non-treated end which can be coupled to a connector through a pressing connector. FIG. 8B or 8C shows a terminal to be coupled to a wire trap type of connector. In this instance, the tin-plated soft copper wire 11 contacts with a contact in the connector while the copper wire 11 is held in adherent contact with the PET sheet 12. Accordingly, it is possible to repeatedly insert and draw the terminal into and out of the connector.

Figure 8D:
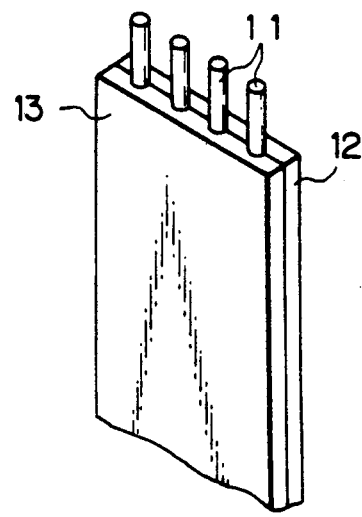
Figure 8E:
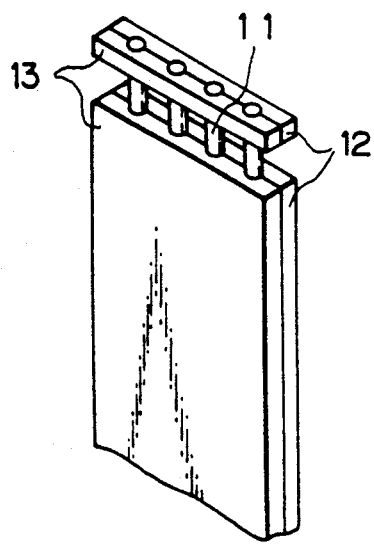
Figure 8F:
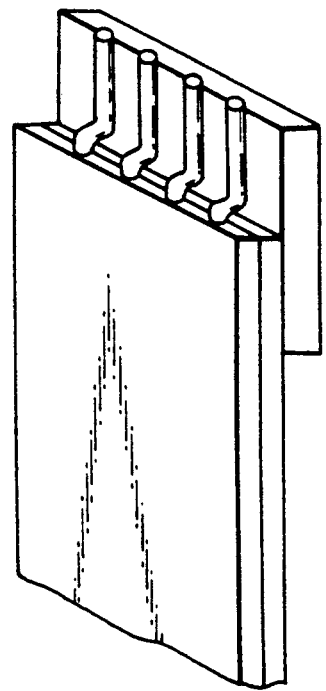

FIG. 8D or 8E shows a terminal to be coupled to a pressing terminal. It is possible to directly press the pressing terminal on the terminal of the present invention since the ends of the soft copper wires 11 are exposed. The terminal shown in FIGS. 8D and 8E can also be coupled to a print base by soldering or spot-welding. FIG. 8F shows a terminal having sufficient strength to withstand insertion and drawing of the connector.

The wiring assembly in accordance with the present invention requires no etching process and can be produced in a short time. Consequently, a low cost and high density wiring like the FPC can be obtained. It is also possible to effectively utilize a space in equipment. Further, in comparison with the FPC, it is possible to realize a rationalization of a wiring operation, since terminal treatment like the FRC can be carried out.

It is possible to make crosses in a circuit by a single wiring assembly using the insulated conductors even though the conventional FPC requires two layers. The present invention can simplify producing steps and obtain a highly functional and economical wiring assembly for equipment.

What is claimed is:
1. A wiring assembly for equipment, comprising:
an insulation sheet formed along a wiring circuit having portions bent at a sharp angle, curved portions, and branched portions;
a plurality of generally round wire conductors arranged along said wiring circuit; and
a flexible insulation material for covering said round wire conductors on said sheet.
2. A wiring assembly according to claim 1, wherein said round wire conductors are conductors with insulation covers.
3. A method of producing a wiring assembly for equipment, comprising the steps of:
arranging a plurality of generally round wire conductors on an insulation sheet in accordance with a wiring circuit having portions bent at a sharp angle, curved portions, and branched portions;
covering said round wire conductors with a flexible insulation material to insulate them and secure them to said sheet; and
cutting out excess portions of said sheet along said wiring circuit.
4. A wiring assembly according to claim 1, wherein said round wire conductors each have a diameter in the range of 0.03 mm to 1.0 mm and are selected from the group consisting of a soft copper wire, a tin-plated soft copper wire, other plated wire, a copper alloy wire, a clad wire made of different metals and a twisted wire including a plurality of wires.
5. A wiring assembly according to claim 2, wherein said conductors with insulation covers are magnet wires.
6. A wiring assembly according to claim 2, wherein said round wire conductors each have a diameter in the range of 0.03 mm to 1.0 mm and are selected from the group consisting of a soft copper wire, a tin-plated soft copper wire, other plated wire, a copper alloy wire, a clad wire made of different metals and a twisted wire including a plurality of wires.

* * * * *